United States Patent
Okushiba (10) Patent No.: US 9,478,691 B2
(45) Date of Patent: Oct. 25, 2016

(54) LIGHT-RECEIVING AND EMITTING DEVICE INCLUDING INTEGRATED LIGHT-RECEIVING AND EMITTING ELEMENT AND SENSOR

(71) Applicant: KYOCERA Corporation, Kyoto-shi, Kyoto (JP)

(72) Inventor: Hiroyuki Okushiba, Kyoto (JP)

(73) Assignee: Kyocera Corporation, Kyoto (JP)

( * ) Notice: Subject to any disclaimer, the term of this patent is extended or adjusted under 35 U.S.C. 154(b) by 131 days.

(21) Appl. No.: 14/354,885

(22) PCT Filed: Oct. 30, 2012

(86) PCT No.: PCT/JP2012/077984
§ 371 (c)(1),
(2) Date: Apr. 28, 2014

(87) PCT Pub. No.: WO2013/065668
PCT Pub. Date: May 10, 2013

(65) Prior Publication Data
US 2014/0264392 A1    Sep. 18, 2014

(30) Foreign Application Priority Data
Oct. 31, 2011    (JP) .................................. 2011-238905

(51) Int. Cl.
*H01L 31/062*    (2012.01)
*H01L 31/12*    (2006.01)
(Continued)

(52) U.S. Cl.
CPC .......... *H01L 31/12* (2013.01); *H01L 31/02019* (2013.01); *H01L 31/022408* (2013.01); *H01L 31/173* (2013.01)

(58) Field of Classification Search
CPC ........... H01L 33/0004–33/648; H01L 25/167; H01L 27/14643–27/156; H01L 27/3227; H01L 31/02024; H01L 31/0203; H01L 31/1032; H01L 31/107; H01L 51/0504; H01L 2223/6638–2223/6694; H01L 2924/1424; H01L 27/14607–27/1461; H01L 27/14609; H01L 27/14641
See application file for complete search history.

(56) References Cited

U.S. PATENT DOCUMENTS 5,285,078 A    2/1994  Mimura et al.
5,608,233 A *  3/1997  Sahara .................. G11B 7/127
                                                257/432
(Continued)

FOREIGN PATENT DOCUMENTS

CN    101336371 A    12/2008
JP    58-204574 A    11/1983
(Continued)

OTHER PUBLICATIONS

Chinese Office Action with English concise explanation, Chinese Patent Application No. 201280052356.9, Jul. 10, 2015, 7 pgs.
(Continued)

*Primary Examiner* — Cuong B Nguyen
(74) *Attorney, Agent, or Firm* — Volpe and Koenig, P.C.

(57) ABSTRACT

The light receiving/emitting device uses an integrated light receiving/emitting element wherein a light receiving element and a light emitting element are provided on one main surface of a substrate. The substrate comprises a first-conductivity-type semiconductor. At least one electrode layer is placed in an area corresponding to at least the light receiving element and the light emitting element on the other main surface of the substrate. The light receiving element comprises: a first second-conductivity-type semiconductor layer formed on the one main surface of the substrate; a first anode electrode formed on the top surface of the first second-conductivity-type semiconductor layer; and a first cathode electrode formed on the top surface of the one main surface of the substrate. The electrode layer, the first anode electrode and the first cathode electrode have the same electric potential.

7 Claims, 5 Drawing Sheets

(51) Int. Cl.
*H01L 31/02* (2006.01)
*H01L 31/0224* (2006.01)
*H01L 31/173* (2006.01)

(56) References Cited

U.S. PATENT DOCUMENTS

| | | | |
|---|---|---|---|
| 8,692,200 B2 * | 4/2014 | Tao | G01J 1/28 250/338.4 |
| 2005/0082463 A1 | 4/2005 | Koyama et al. | |
| 2005/0110026 A1 | 5/2005 | Plaine et al. | |
| 2007/0267665 A1 | 11/2007 | Koyama et al. | |
| 2008/0153189 A1 | 6/2008 | Plaine et al. | |
| 2009/0105564 A1 | 4/2009 | Tokita | |
| 2012/0025064 A1 | 2/2012 | Koyama et al. | |

FOREIGN PATENT DOCUMENTS

| | | |
|---|---|---|
| JP | 59-161661 A | 10/1984 |
| JP | 01-254080 A | 10/1989 |
| JP | 06-097420 A | 4/1994 |
| JP | 08-046236 A | 2/1996 |
| JP | 2005-109494 A | 4/2005 |
| JP | 2005-129909 A | 5/2005 |

OTHER PUBLICATIONS

International Search Report, PCT/JP2012/077984, Nov. 22, 2012, 2 pgs.

* cited by examiner

LIGHT-RECEIVING AND EMITTING DEVICE INCLUDING INTEGRATED LIGHT-RECEIVING AND EMITTING ELEMENT AND SENSOR

TECHNICAL FIELD

The present invention relates to a light-receiving and emitting device including an integrated light-receiving and emitting element in which a light-receiving element and a light-emitting element are integrally disposed on the same substrate and a sensor.

BACKGROUND ART

Various sensors to detect characteristics of a material to be irradiated by irradiating light from a light-emitting element to the material to be irradiated and receiving the regularly reflected light and diffuse-reflected light with respect to the light incident on the material to be irradiated by a light-receiving element have been proposed previously. These sensors have been utilized in broad fields and have been used for the wide variety of applications, for example, photointerrupters, photocouplers, remote control units, IrDA (Infrared Data Association) communications devices, optical fiber communications devices and, furthermore, manuscript size sensors.

In such a sensor, for example, in the case where the regularly reflected light of the light irradiated from a light-emitting element to a material to be irradiated is received by a light-receiving element, it is preferable that the light-emitting element and the light-receiving element be disposed at locations closer to each other in order to receive the regularly reflected light by the light-receiving element more accurately.

For example, Japanese Unexamined Patent Application Publication No. 8-46236 describes a light-receiving and emitting element array in which one surface of a silicon semiconductor substrate is doped with an impurity and a shallow pn junction region taking responsibility for a light-receiving function and a deep pn junction region taking responsibility for a light-emitting function are disposed adjoining to each other.

However, in the case where a light-receiving element and a light-emitting element are integrally disposed on the same substrate, when the light-emitting element is driven, a leakage current (so-called noise current) is generated and may flow into the light-receiving element through the silicon substrate. This leakage current admixes as an error component (noise) with the output current (current output in accordance with the intensity of the received light) from the light-receiving element. Consequently, the light-receiving and emitting element in the related art has an issue that the accuracy in detection of the reflected light by the light-receiving element is reduced because of generation of such a noise current. This leakage current increases as the light-receiving element and the light-emitting element are disposed at locations closer to each other. That is, it is desirable that a light-emitting portion be closer to a light-receiving portion in order to receive the regularly reflected light by the light-receiving element accurately, but on the other hand, a leakage current relatively increases. Therefore, there is an issue that the detection accuracy of the light-receiving and emitting element array in the related art cannot be relatively improved.

The present invention has been made in consideration of the above-described problems and an object is to provide a light-receiving and emitting device exhibiting relatively high accuracy in detection of the reflected light by a light-receiving element, wherein a leakage current generated by driving of a light-emitting element is relatively suppressed from flowing into the light-receiving element even in a light-receiving and emitting device including an integrated light-receiving and emitting element in which a light-receiving element and a light-emitting element are integrally disposed close to each other on the same substrate.

SUMMARY OF INVENTION

A light-receiving and emitting device according to an embodiment of the present invention includes an integrated light-receiving and emitting element in which a light-receiving element and a light-emitting element are disposed on one principal surface of a substrate, wherein the above-described substrate is formed of a one conductivity type semiconductor, at least one electrode layer is disposed in at least a region corresponding to the above-described light-receiving element and the above-described light-emitting element on the other principal surface of the above-described substrate, the above-described light-receiving element includes a first other conductivity type semiconductor layer on a side of the one principal surface of the above-described substrate, a first anode on the upper surface of the first other conductivity type semiconductor layer, and a first cathode on the upper surface of the one principal surface of the above-described substrate, an operational amplifier in which an inverting input terminal is connected to the above-described first anode and a non-inverting input terminal is connected to the above-described first cathode and the above-described electrode layer is further included, and the above-described electrode layer, the above-described first anode, and the above-described first cathode are at the same potential.

DESCRIPTION OF EMBODIMENTS

Light-Receiving and Emitting Device

A light-receiving and emitting device according to the present invention will be described below with reference to the drawings. The examples described below are exemplifications of the embodiments according to the present invention, and the present invention is not limited to these embodiments.

Figure 1:
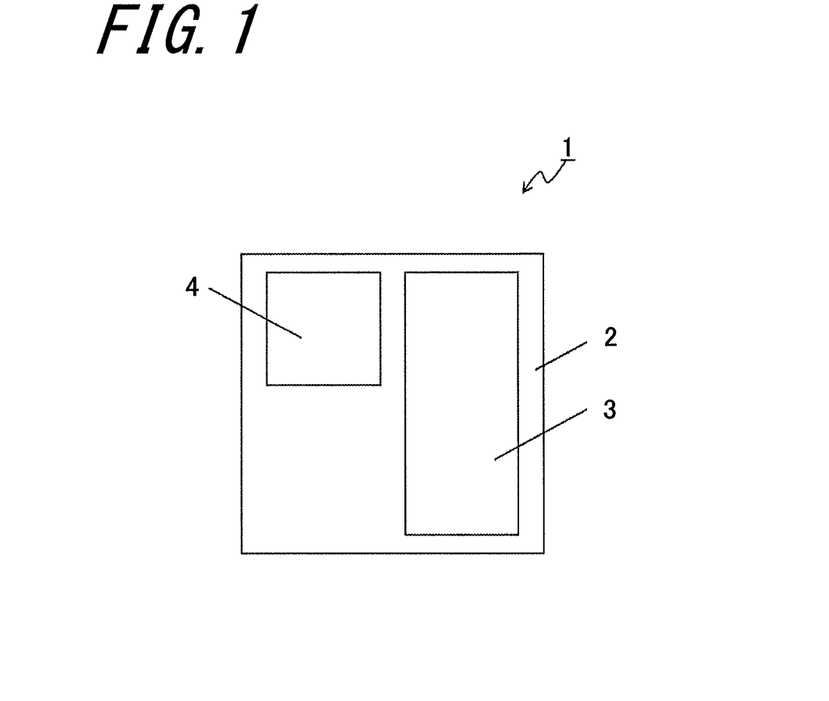
FIG. 1 is a schematic diagram of a light-receiving and emitting device according to an embodiment of the present invention.

A light-receiving and emitting device 1 shown in FIG. 1 is incorporated in an electrophotographic device, e.g., a page printer, and functions as a sensor.

The light-receiving and emitting device 1 includes an integrated light-receiving and emitting element 3 and an operational amplifier 4 on the upper surface of the base substrate 2. The integrated light-receiving and emitting element 3 and the operational amplifier 4 are mounted on the upper surface of the base substrate 2 with a thermosetting adhesive, e.g., an epoxy based resin, therebetween.

The base substrate 2 functions as a support object for the integrated light-receiving and emitting element 3 and the operational amplifier 4 and as a circuit board to electrically connect the integrated light-receiving and emitting element 3 and the operational amplifier 4 and electrically connect the integrated light-receiving and emitting element 3 and the power supply and the like disposed in the outside.

Any material may be used as a constituent material for the base substrate 2. In the present embodiment, a circuit board formed from a glass epoxy resin is used. In the present embodiment, the base substrate 2 is rectangular, although the shape is not limited thereto.

Figure 2:
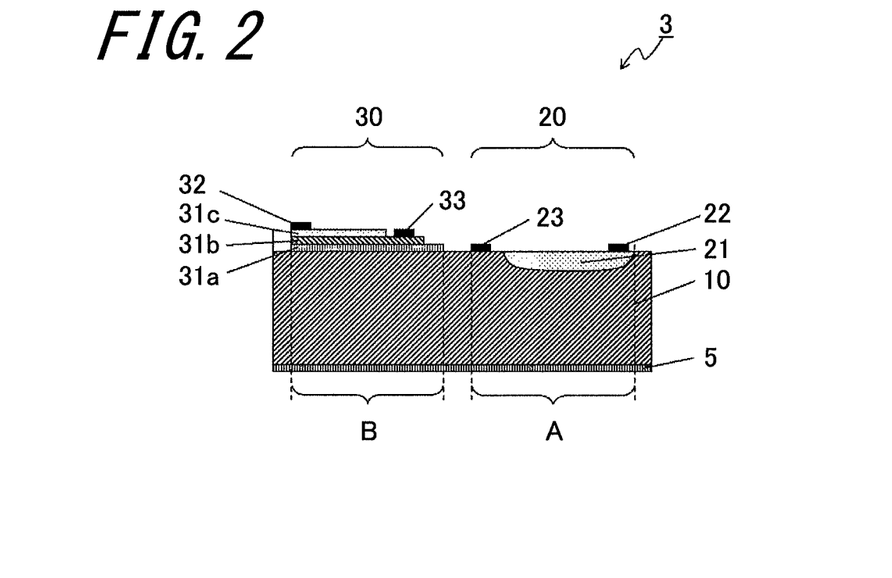
FIG. 2 is a sectional view of an integrated light-receiving and emitting element constituting the light-receiving and emitting device shown in FIG. 1.

As shown in FIG. 2, the integrated light-receiving and emitting element 3 includes a substrate 10, a light-receiving element 20 and a light-emitting element 30 on the upper surface of the substrate 10, and an electrode layer 5 on the lower surface of the substrate 10.

The substrate 10 is made from a single crystal of, for example, silicon (Si), gallium arsenide (GaAs), gallium phosphide (GaP), or gallium nitride (GaN). Also, the substrate 10 is doped with an n-type impurity or a p-type impurity and, thereby, is an n-type semiconductor substrate or a p-type semiconductor substrate. Examples of n-type impurities include silicon (Si), selenium (Se), and phosphorus (P), and the concentrations thereof are specified to be $1\times10^{16}$ to $1\times10^{20}$ atoms/cm$^3$. Examples of p-type impurities include zinc (Zn), magnesium (Mg), carbon (C), and boron (B), and the concentrations thereof are specified to be $1\times10^{16}$ to $1\times10^{20}$ atoms/cm$^3$. As for the substrate 10 in the present example, an n-type semiconductor substrate is used, wherein silicon (Si) is doped with phosphorus (P) at a concentration of $1\times10^{15}$ atoms/cm$^3$.

The light-receiving element 20 includes a semiconductor layer 21 doped with a p-type impurity or an n-type impurity on the upper surface side of the base substrate 10, a first anode 22 disposed on the upper surface of the semiconductor layer, and a cathode 23 disposed close to this semiconductor layer 21 and on the upper surface of the substrate 10.

In the light-receiving element 20, a pn junction is formed by disposing the semiconductor layer 21 doped with a p-type impurity or an n-type impurity on the upper surface side of the base substrate 10. That is, when the base substrate 10 is an n-type semiconductor, doping with a p-type impurity is performed and when the base substrate 10 is a p-type semiconductor, doping with an n-type impurity is performed, so that the pn junction is formed. When light enters this pn junction, electrons and holes are generated and a photocurrent is generated.

The semiconductor layer 21 is formed by being doped with, for example, atoms of zinc (Zn), magnesium (Mg), carbon (C), boron (B), aluminum (Al), gallium (Ga), or the like as the p-type impurity, or atoms of antimony (Sb), phosphorus (P), arsenic (As), silicon (Si), selenium (Se), or the like as the n-type impurity at a concentration of $1\times10^{16}$ to $1\times10^{20}$ atoms/cm$^3$ in such a way that the thickness becomes 0.5 to 3 μm. The semiconductor layer 21 according to the present embodiment is a p-type semiconductor layer in which silicon (Si) is doped with $1\times10^{18}$ atoms/cm$^3$ of boron (B).

The first anode 22 is disposed on the upper surface of the semiconductor layer 21. The first anode 22 is made from, for example, an alloy of gold (Au) and chromium (Cr), an alloy of aluminum (Al) and chromium (Cr), or an alloy of platinum (Pt) and titanium (Ti), and the thickness thereof is specified to be 0.5 to 5 μm.

Then, the first cathode 23 is disposed close to the semiconductor layer 21 and on the upper surface of the base substrate 10. The first cathode is made from, for example, an alloy of gold (Au) and antimony (Sb), and the thickness thereof is specified to be 0.5 to 5 μm.

On the other hand, the light-emitting element 30 includes an intrinsic semiconductor layer 31a on the upper surface of the base substrate 10, an n-type semiconductor layer 31b on the upper surface of the intrinsic semiconductor layer 31a, a p-type semiconductor layer 31c and the second cathode 33 on the upper surface of the n-type semiconductor layer 31b, and the second anode 32 on the upper surface of the p-type semiconductor layer 31c.

The pn junction of the semiconductor is formed by the n-type semiconductor layer 31b and the p-type semiconductor layer 31c, and the light-emitting element 30 emits light by feeding a current to this pn junction and recombining electrons and holes.

The intrinsic semiconductor layer 31a is made from a single crystal of gallium arsenide (GaAs), indium gallium arsenide (InGaAs), aluminum gallium arsenide (AlGaAs), gallium indium phosphide (GaInP), aluminum gallium indium phosphide (AlGaInP), gallium nitride (GaN) or the like which is not doped with an impurity, and the thickness thereof is specified to be 0.1 to 2 μm. The intrinsic semiconductor layer 31a according to the present embodiment is indium gallium arsenide (InGaAs).

In this regard, the intrinsic semiconductor layer 31a in the present embodiment is not intentionally doped with an impurity. However, Si and the like may admix as incidental impurities at a concentration of $1\times10^{14}$ atoms/cm$^3$ in the production process of the semiconductor.

Meanwhile, in order to prevent misfit dislocation on the basis of a lattice constant mismatch between the substrate 10 and the intrinsic semiconductor layer 31a, a buffer layer may be disposed on the upper surface of the base substrate 10 and the intrinsic semiconductor layer 31a may be disposed on the upper surface of the buffer layer. The buffer layer in this case is made from a single crystal of gallium arsenide (GaAs) or the like, and the thickness thereof is specified to be 0.1 to 1 μm.

The n-type semiconductor layer 31b is made from, for example, a single crystal of gallium arsenide (GaAs), aluminum gallium arsenide (AlGaAs), gallium indium phosphide (GaInP), aluminum gallium indium phosphide (AlGaInP), gallium nitride (GaN), or the like which is doped with atoms of sulfur (S), silicon (Si), selenium (Se), tin (Sn), phosphorus (P), or the like serving as the n-type impurity, and the thickness thereof is specified to be 1 to 4 µm. The concentration of the n-type impurity is specified to be, for example, $1 \times 10^{16}$ to $1 \times 10^{20}$ atoms/cm$^3$. In the n-type semiconductor layer 31b according to the present embodiment, gallium arsenide (GaAs) is doped with silicon (Si) at a concentration of about $1 \times 10^{18}$ atoms/cm$^3$.

The second cathode 33 on the upper surface of the n-type semiconductor layer 31b is formed by using, for example, an alloy of gold (Au) and antimony (Sb), an alloy of gold (Au) and germanium (Ge), a nickel based alloy, or the like and the thickness thereof is specified to be 0.5 to 5 µm.

The p-type semiconductor layer 31c is made from, for example, a single crystal of gallium arsenide (GaAs), aluminum gallium arsenide (AlGaAs), gallium indium phosphide (GaInP), aluminum gallium indium phosphide (AlGaInP), gallium nitride (GaN), or the like which is doped with atoms of zinc (Zn), magnesium (Mg), carbon (C), or the like serving as the p-type impurity, and the thickness thereof is specified to be 1 to 4 µm. The concentration of the p-type impurity is specified to be, for example, $1 \times 10^{16}$ to $1 \times 10^{20}$ atoms/cm$^3$. In the p-type semiconductor layer 31c according to the present embodiment, gallium arsenide (GaAs) is doped with zinc (Zn) at a concentration of $1 \times 10^{18}$ atoms/cm$^3$.

The second anode 32 on the upper surface of the p-type semiconductor layer 31c is made from an alloy of gold (Au) and nickel (Ni), an alloy of gold (Au) and chromium (Cr), an alloy of gold (Au) and titanium (Ti), an alloy of aluminum (Al) and chromium (Cr), or the like and the thickness thereof is specified to be 0.5 to 5 p.m.

The second anode 32 and the second cathode 33 included in the light-emitting element 30 are connected to an external power supply, although not shown in the drawing, through wires of gold (Au), aluminum (Al), or the like. A forward voltage is applied between the second anode 32 and the second cathode 33 and, thereby, a current is fed to the p-type semiconductor layer 31c and the n-type semiconductor layer 31b, so that the light-emitting element 30 is allowed to emit light. In this regard, the connection of the second anode 32 and second cathode 33 to the external power supply is not limited to the connection through the wire. The connection may be previously known flip-chip connection, electrically conductive paste connection, or the like and is not specifically limited.

The electrode layer 5 is formed from an electrically conductive material, e.g., gold (Au) or aluminum (Al), and the thickness thereof is specified to be 0.2 to 3 µm. At least one electrode layer 5 is disposed in at least a region corresponding to the light-receiving element 20 and the light-emitting element 30 on the lower surface of the base substrate 10. Here, in the case of the light-receiving element 20, the corresponding region refers to the region which is indicated by A shown in FIG. 2 and which includes the region corresponding to the semiconductor layer 21, the region corresponding to the first cathode 23, and the region corresponding to the region sandwiched between them, and in the case of the light-emitting element 30, the corresponding region refers to the region which is indicated by B shown in FIG. 2 and which corresponds to the intrinsic semiconductor layer 31a. In this regard, in the case where the second anode 32 and the second cathode 33 included in the light-emitting element 30 are present in regions outside the intrinsic semiconductor layer 31a, as with the case of the above-described light-receiving element 20, the corresponding region refers to the region including the region corresponding to the intrinsic semiconductor layer 31a, the regions corresponding to the electrodes present outside the intrinsic semiconductor layer 31a and, if any, the region corresponding to the region sandwiched between these regions. The electrode layer 5 in the present embodiment is made from gold (Au) in such a way as to cover all over the lower surface of the substrate 10 and the thickness thereof is specified to be 1 µm.

The above-described integrated light-receiving and emitting element 3 is formed by the previously known semiconductor manufacturing method, e.g., a thermal oxidation method, a sputtering method, a plasma CVD method, a photolithography method, an etching method, or a resistance heating evaporation method. In the present embodiment, explanations of insulating layers on the various semiconductor layers constituting the light-receiving element 20 and the light-emitting element 30 are not provided. However, needless to say, insulating layers are disposed as necessary.

Figure 3:
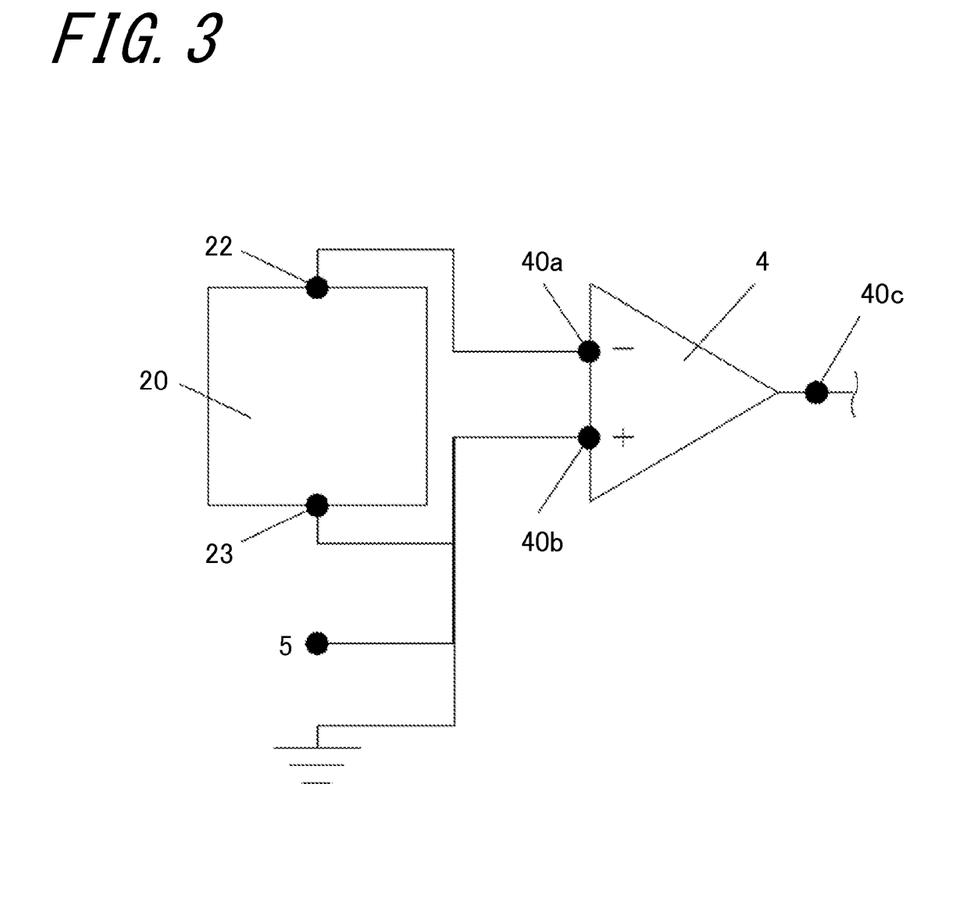
FIG. 3 is a schematic connection diagram of a light-receiving element and an operational amplifier constituting the light-receiving and emitting device shown in FIG. 1.

The operational amplifier 4 includes an inverting input terminal 40a, a non-inverting input terminal 40b, and an output terminal 40c and functions as a differential amplifier to output a voltage proportionate to a potential difference generated between the inverting input terminal 40a and the non-inverting input terminal 40b.

As shown in the schematic connection diagram in FIG. 3, the inverting input terminal 40a is connected to the first anode 22 included in the light-receiving element 20 and the non-inverting input terminal 40b is connected to the first cathode 23 included in the light-receiving element 20 and the electrode layer 5 included in the base substrate 10 through wires, bumps, Ag pastes, Cu wirings, or the like. Then, the first anode 22, the first cathode 23, and the electrode layer 5 are specified to be at the same potential. That is, the first anode 22 of the light-receiving element 20 connected to the inverting input terminal 40a of the operational amplifier 4 and the first cathode 23 and the electrode layer 5 connected to the non-inverting input terminal 40b are specified to be in the state of a so-called imaginal short circuit (may be referred to as virtual short circuit). In the present embodiment, the first anode 22 of the light-receiving element 20 connected to the inverting input terminal 40a of the operational amplifier 4 and the first cathode and the electrode layer 5 connected to the non-inverting input terminal 40b are specified to be at the ground potential. That is, the light-receiving element 20 is driven in a zero bias mode.

Meanwhile, although not shown in the drawing, it is needless to say that the operational amplifier 4 includes a feedback resistance connected between the inverting input terminal 40a and the output terminal 40c and a power supply to drive the operational amplifier 4. A resistance of 1 kΩ to 10 MΩ is adopted as the feedback resistance.

As described above, even when a leakage current (so-called noise current) is generated by the light-emitting element 30 being driven, flowing into the light-receiving element 20 through the substrate 10 can be relatively suppressed by connecting the light-receiving element 20 to the operational amplifier 4.

This point will be explained in detail. To begin with, the mechanism of generation of a leakage current by the light-emitting element 30 being driven will be described. When the light-emitting element 30 is turned ON or OFF, the junction interface between the n-type semiconductor layer 31b connected to the second cathode 33 included in the light-emitting element 30 and the intrinsic semiconductor layer 31a, the junction interface between the intrinsic semiconductor layer 31a and the base substrate 10, and the intrinsic semiconductor layer 31a present between them constitute a capacitor, and carriers (electrons or holes)

serving as sources of the leakage current are generated just below the junction interface between the intrinsic semiconductor layer 31a and the base substrate 10 because of the capacitive coupling. These carriers diffuse in the inside of the base substrate 10 and serve as the leakage current (so-called noise current).

If this leakage current flows from the light-emitting element 30 side to the light-receiving element 20 side, admixture as an error component (noise) with the output current from the light-receiving element 20 (current which is taken from the first anode 22 and which is output in accordance with the intensity of the received light) occurs.

The above-described carriers generated are discharged from the base substrate 10 to the outside by specifying the first cathode 23 of the light-receiving element 20 to be at the ground potential. However, the leakage current is not entirely discharged from the base substrate 10 to the outside because of dimensional limitations, e.g., an area and a thickness, of the first cathode 23 of the light-receiving element 20. Then, the above-described carriers generated can be discharged promptly from the base substrate 10 to the outside through the electrode layer 5 by disposing the electrode layer 5 having a relatively large area in at least the region corresponding to the light-receiving element 20 and the light-emitting element 30 on the lower surface of the base substrate 10 and specifying the electrode layer 5 to be at the ground potential. Consequently, the leakage current generated because of the capacitive coupling by the light-emitting element 30 being driven is relatively suppressed from flowing into the light-receiving element 20 and is discharged to the outside through the electrode layer 5.

(Sensor)

Next, a using method in the case where the light-receiving and emitting device according to the present embodiment is used as a sensor will be described. In this regard, the case where this sensor is applied to a sensor to detect the concentration of a toner T (material to be irradiated) adhered on an intermediate transfer belt V in an electrophotographic device, e.g., a copying machine and a printer, will be described below as an example.

Figure 4:
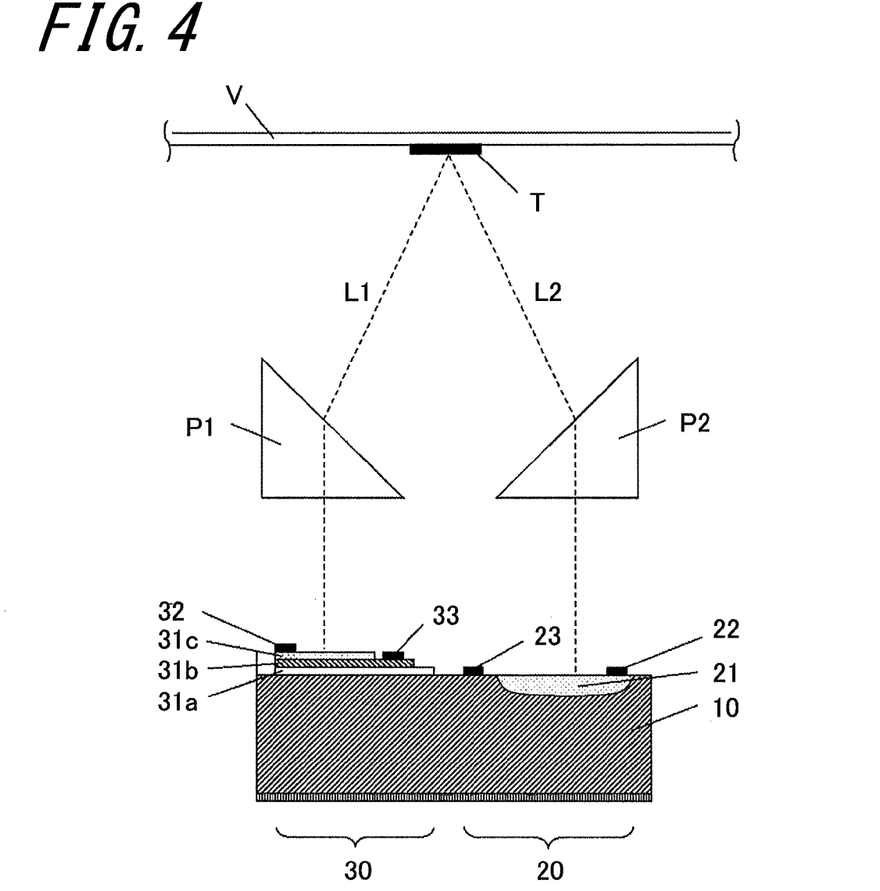
FIG. 4 is a diagram illustrating a method for using the light-receiving and emitting device shown in FIG. 1 as a sensor.

As shown in FIG. 4, in a sensor according to the present embodiment, the surface provided with the light-receiving element 20 and the light-emitting element 30 of a light-receiving and emitting device 1 is arranged opposing to the intermediate transfer belt V. Subsequently, light is irradiated from the light-emitting element 30 to the toner T on the intermediate transfer belt V. In this regard, in the present embodiment, a prism P2 is arranged above the light-receiving element 20 and a prism P1 is arranged above the light-emitting element 30. The light emitted just above the pn junction region of the light-emitting element 30 is refracted by the prism P1 and is incident on the toner on the intermediate transfer belt V. Then, regularly reflected light L2 with respect to this incident light L1 is refracted by the prism P2 and is received by the light-receiving element 20. In this light-emitting element 20, a photocurrent is generated in accordance with the intensity of the received light, and this photocurrent is detected by an external drive circuit through the first anode 22.

As described above, the sensor according to the present embodiment can detect a photocurrent in accordance with the intensity of the regularly reflected light from the toner T. The intensity of the regularly reflected light also corresponds to the concentration of the toner T and, therefore, the concentration of the toner T can be detected in accordance with the amount of the photocurrent generated.

In this regard, in the case where the concentration of the toner T is specified to be constant, detection can be performed as the information of the distance of the intermediate transfer belt V from the sensor.

Up to this point, the specific embodiment according to the present invention has been shown. However, the light-receiving and emitting device according to the present invention is not limited to this, and various modifications can be made within the bounds of not departing from the gist of the present invention.

For example, in the present embodiment, the first anode 22, the first cathode, and the electrode layer 5 included in the light-receiving element 20 are specified to be at the same potential, although the second cathode 33 included in the light-emitting element 30 may be further specified to be at the same potential. In the case where such a configuration is employed, the potential difference generated between the junction interface between the n-type semiconductor layer 31b and the intrinsic semiconductor layer 31a and the junction interface between the intrinsic semiconductor layer 31a and the base substrate 10 by the light-emitting element 30 being driven can be relatively reduced. That is, the induced voltage can be reduced and, thereby, generation of the leakage current can be relatively suppressed.

Figure 5:
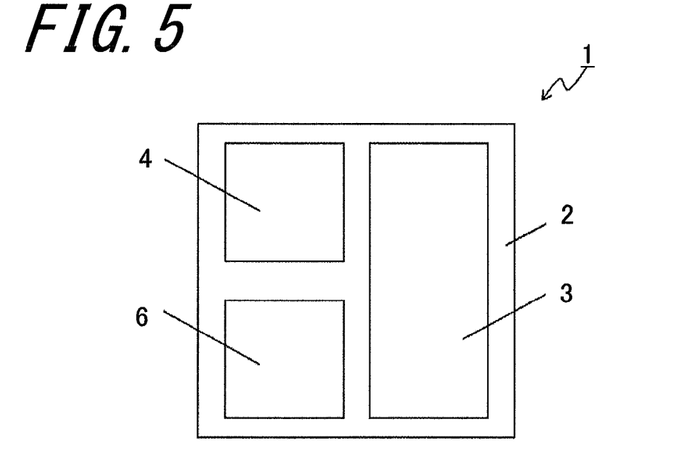
FIG. 5 is a schematic diagram showing a first modified example of the light-receiving and emitting device shown in FIG. 1.

Also, as shown in a first modified example in FIG. 5, the light-receiving and emitting device 1 according to the present embodiment may further include a power supply 6. In the case where such a configuration is employed, although the first anode 22, the first cathode 23, and the electrode layer 5 included in the light-receiving element 20 are specified to be at the same potential, these potentials can be specified to be at the same positive potential. In the case where these potentials are specified to be at the same positive potential, the power supply to drive the operational amplifier 4 can be made a single power supply, so that the light-receiving and emitting device can be miniaturized. In the case where the first anode 22, the first cathode 23, and the electrode layer 5 are specified to be at the ground potential, as described above, the power supply to drive the operational amplifier 4 is formed from two power supplies of a positive power supply and a negative power supply. However, in the case where the first anode 22, the first cathode 23, and the electrode layer 5 in the light-receiving element 20 are specified to be at the same positive potential, the power supply to drive the operational amplifier 4 may be a single power supply of only a positive power supply. The reason is as described below. In the former case, a positive power supply and a negative power supply are required because conversion of a light current, which flows when the light is incident on the light-receiving element 20, and a dark current which flows when the light is not incident, to voltages result in a negative potential and the ground potential, respectively. On the other hand, in the latter case, when the light current and the dark current are converted to respective voltages, it is possible that both are specified to be positive potentials. Therefore, the power supply can be a single power supply of only a positive power supply.

Figure 6:
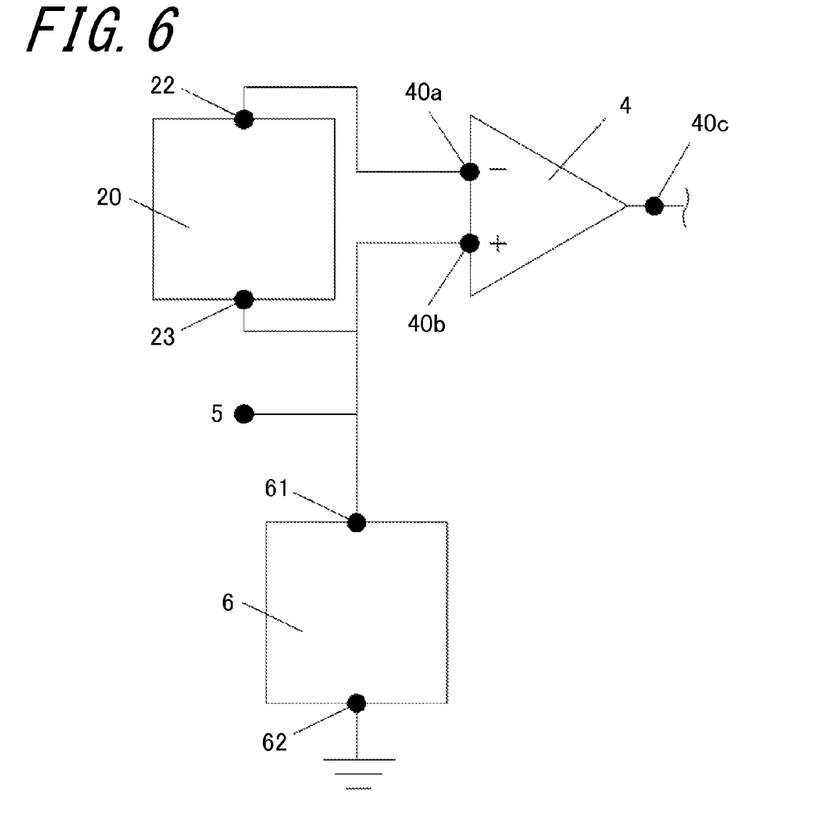
FIG. 6 is a schematic connection diagram of a light-receiving element, an operational amplifier, and a power supply constituting the first modified example of the light-receiving and emitting device shown in FIG. 5.

A specific method for allowing the first anode 22, the first cathode 23, and the electrode layer 5 to become at the same positive potential will be described. As shown in FIG. 6, the power supply 6 includes a first power supply terminal 61 and a second power supply terminal 62. The first power supply terminal 61 is connected to the first cathode 23 and the electrode layer 5, and the second power supply terminal 62 is specified to be at the ground potential.

Figure 7:
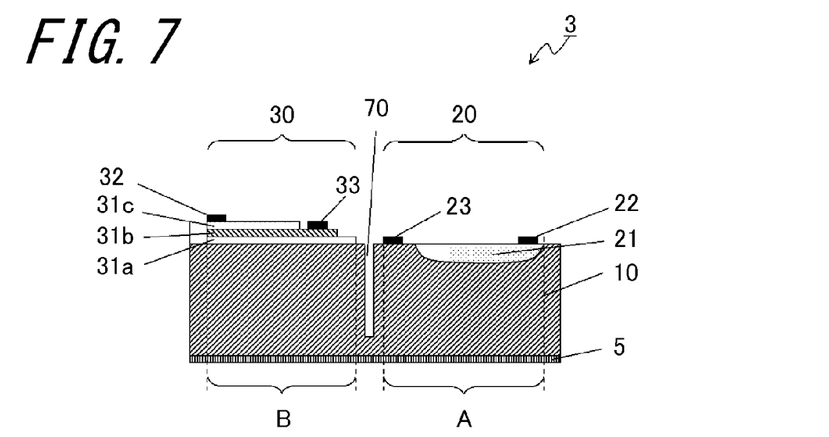
FIG. 7 is a sectional view of an integrated light-receiving and emitting element constituting a second modified example of the light-receiving and emitting device shown in FIG. 1.
Figure 8:
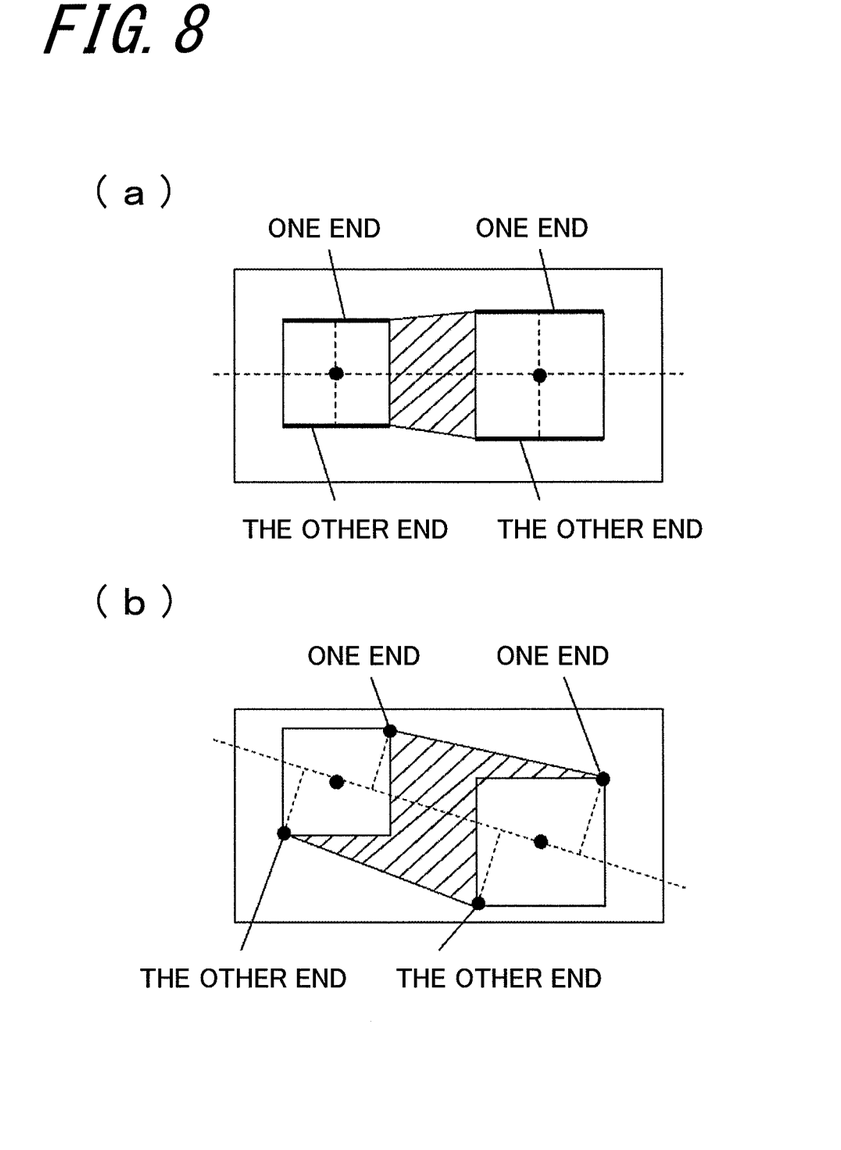
FIG. 8 is a diagram illustrating a region sandwiched between a light-receiving element and a light-emitting element constituting an integrated light-receiving and emitting element.

In addition, as shown in a second modified example in FIG. 7, a groove 70 located between the light-receiving element 20 and the light-emitting element 30 of the integrated light-receiving and emitting element 3 may be included. Both ends of the groove 70 are located outside the region sandwiched between the light-receiving element 20 and the light-emitting element 30. Here, the region sandwiched between the light-receiving element 20 and the light-emitting element 30 will be described with reference to FIG. 8 (*a*) and (*b*). In one side of a line segment bonding the center of the light-receiving element 20 and the center of the light-emitting element 30, one end having a longest perpendicular distance from this line segment is determined and in the other side, the other end having a longest perpendicular distance from this line segment is determined. The region (shaded portion) surrounded by the straight line bonding one end of the light-receiving element 20 and one end of the light-emitting element 30 at the shortest distance, the straight line bonding the other ends of the two at the shortest distance, the outline from the one end to the other end of the light-receiving element 20, and the outline from the one end to the other end of the light-emitting element 30 is defined as the region sandwiched between the light-receiving element 20 and the light-emitting element 30.

The groove 70 is formed by making a slit in the substrate 10 with a diamond blade or the like. Even when a leakage current generated by the above-described light-emitting element 30 being driven is going to flow, for example, from the light-emitting element 30 side to the light-receiving element 20 side, it is necessary because of this groove 70 that the leakage current flow between the groove 70 and the electrode layer 5 to avoid the groove 70. Therefore, the physical distance of movement of the leakage current increases, so that an influence exerted on the light-receiving element 20 is relatively reduced. Alternatively, when the leakage current flows between the groove 70 and the electrode layer 5, the current flows to the outside through the electrode layer 5 disposed nearby, so that an influence of the leakage current exerted on the light-receiving element 20 can be relatively reduced.

REFERENCE SIGNS LIST 1 light-receiving and emitting device
2 base substrate
3 integrated light-receiving and emitting element
4 operational amplifier
5 electrode layer
6 power supply
10 base substrate
20 light-receiving element
21 semiconductor layer
22 first anode
23 first cathode
30 light-emitting element
31*a* intrinsic semiconductor layer
31*b* n-type semiconductor layer
31*c* p-type semiconductor layer
33 second anode
40 second cathode
40*a* inverting input terminal
40*b* non-inverting input terminal
40*c* output terminal
61 first power supply terminal
62 second power supply terminal
70 groove

The invention claimed is:

1. A light-receiving and emitting device, comprising:
an integrated light-receiving and emitting element in which a light-receiving element and a light-emitting element are disposed on one principal surface of a substrate, wherein
the substrate is formed of a one conductivity type semiconductor,
at least one electrode layer is disposed in at least a region corresponding to the light-receiving element and the light-emitting element on another principal surface of the substrate,
the light-receiving element comprises a first other conductivity type semiconductor layer on a side of the one principal surface of the substrate, a first anode on an upper surface of the first other conductivity type semiconductor layer, and a first cathode on the one principal surface of the substrate,
an operational amplifier in which an inverting input terminal is connected to the first anode and a non-inverting input terminal is connected to the first cathode and the electrode layer is further comprised, and
the electrode layer, the first anode, and the first cathode are at a same potential.

2. The light-receiving and emitting device according to claim 1, wherein
the light-emitting element comprises a semiconductor layer comprising an intrinsic semiconductor layer on the one principal surface of the substrate and at least a second one conductivity type semiconductor layer and a second other conductivity type semiconductor layer above the intrinsic semiconductor layer,
the second other conductivity type semiconductor layer is smaller than the second one conductivity type semiconductor layer and exposes part of an upper surface of the second one conductivity type semiconductor layer,
a second cathode is disposed on the upper surface of the second one conductivity type semiconductor layer, and a second anode is disposed on an upper surface of the second other conductivity type semiconductor layer,
the non-inverting input terminal is further connected to the second cathode, and
the electrode layer, the first anode, the first cathode, and the second cathode are at the same potential.

3. The light-receiving and emitting device according to claim 1, wherein the same potential is a ground potential.

4. The light-receiving and emitting device according to claim 1, wherein the same potential is a positive potential.

5. The light-receiving and emitting device according to claim 4, further comprising a power supply in which a first power supply terminal is connected to the first cathode and the electrode layer, and the second power supply terminal is at the ground potential.

6. The light-receiving and emitting device according to claim 1, wherein
a groove located between the light-receiving element and the light-emitting element is disposed in the one principal surface of the substrate, and
both ends of the groove are located outside a region sandwiched between the light-receiving element and the light-emitting element.

7. A sensor, comprising:
ht-receiving and emitting device according to claim 1, wherein
light is irradiated from the light-emitting element toward a material to be irradiated, and at least one of a distance information and a concentration information of the material to be irradiated is detected on a basis of an output current output from the light-receiving element in accordance with a reflected light from the material to be irradiated.

\* \* \* \* \*